United States Patent
Lin et al.

(10) Patent No.: US 9,437,130 B2
(45) Date of Patent: Sep. 6, 2016

(54) DISPLAY PANEL AND METHOD FOR MANUFACTURING THE SAME

(71) Applicant: AU Optronics Corporation, Hsin-Chu (TW)

(72) Inventors: Wei-Li Lin, Hsin-Chu (TW); Yi-Suei Liao, Hsin-Chu (TW); Chun-Huan Chang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 212 days.

(21) Appl. No.: 14/324,548

(22) Filed: Jul. 7, 2014

(65) Prior Publication Data

US 2015/0194090 A1 Jul. 9, 2015

(30) Foreign Application Priority Data

Jan. 6, 2014 (TW) .............................. 103100381 A (51) Int. Cl.
*G09G 3/20* (2006.01)
*G11C 19/28* (2006.01)

(52) U.S. Cl.
CPC ............. *G09G 3/2092* (2013.01); *G11C 19/28* (2013.01); *G09G 2310/0267* (2013.01); *G09G 2310/0275* (2013.01); *G09G 2310/0286* (2013.01); *G09G 2310/0291* (2013.01); *G09G 2310/067* (2013.01); *G09G 2330/06* (2013.01)

(58) Field of Classification Search
CPC ................... G09G 3/2092; G09G 2310/0291; G09G 2310/067; G09G 2310/0286; G09G 2310/0275; G09G 2310/0267; G09G 2330/06; G11C 19/00; G11C 19/28
See application file for complete search history.

(56) References Cited

U.S. PATENT DOCUMENTS

| | | | |
|---|---|---|---|
| 6,900,969 B2 | 5/2005 | Salling et al. | |
| 8,514,200 B2 | 8/2013 | Huang et al. | |
| 2006/0061535 A1* | 3/2006 | Kim ..................... | G09G 3/3677 345/98 |
| 2007/0007557 A1* | 1/2007 | Kwak .................. | G09G 3/3677 257/239 |
| 2007/0200968 A1 | 8/2007 | Chang | |
| 2009/0045733 A1 | 2/2009 | Suh et al. | |
| 2009/0115690 A1* | 5/2009 | Chang ..................... | G09G 3/006 345/55 |
| 2010/0150302 A1 | 6/2010 | Tsai et al. | |
| 2010/0260312 A1* | 10/2010 | Tsai ..................... | G09G 3/3677 377/79 |
| 2012/0098800 A1* | 4/2012 | Kim ..................... | G09G 3/3677 345/204 |
| 2013/0106677 A1* | 5/2013 | Koo ....................... | G11C 19/28 345/87 |
| 2014/0098014 A1 | 4/2014 | Liao et al. | |

FOREIGN PATENT DOCUMENTS

| | | |
|---|---|---|
| CN | 102982779 | 3/2013 |
| TW | I248185 | 1/2006 |
| TW | 200732742 | 9/2007 |
| TW | 201301765 | 1/2013 |

* cited by examiner

*Primary Examiner* — Priyank Shah
(74) *Attorney, Agent, or Firm* — WPAT, PC; Justin King (57) ABSTRACT

A display panel includes a display area, a shift register circuit, a first start signal line, and a second start signal line. The shift register circuit is electrically coupled to the display area through a plurality of signal output lines. The first start signal line and the second start signal line are electrically coupled to the shift register circuit. The first start signal line and the second start signal line are both arranged without crossing the signal output lines.

8 Claims, 5 Drawing Sheets

DISPLAY PANEL AND METHOD FOR MANUFACTURING THE SAME

RELATED APPLICATIONS

This application claims priority to Taiwan Application Serial Number 103100381, filed Jan. 6, 2014, which is herein incorporated by reference.

BACKGROUND

1. Field of Invention

The present invention relates to a display panel. More particularly, the present invention relates to a wiring configuration associated with shift registers in a display panel.

2. Description of Related Art

With the fierce competition of the display panel industry, slim appearance and lightweight feel has gradually become the focus of technology development. Generally speaking, the gate driver integrated circuit (Gate Driver IC) is integrated into the glass substrate so as to achieve a narrow bezel.

In the conventional display panel, the start signal line for transmitting the start signal and the signal output lines for transmitting the gate signals are disposed between the shift register circuit and the display area so that wiring of the start signal line crosses wiring of the signal output lines. Since the gate signals output by the signal output lines are the major information input to the display panel, the crossing of wiring will induce the phenomenon of electrostatic discharge (ESD), thus resulting in wrong information displayed on the display panel. In addition, as the resolution of the display panel is higher and higher, the situation of crossing of wiring is more and more obvious. The possibility of the occurrence of electrostatic discharge is increased correspondingly, which increases the probability of abnormal displays on the display panel.

For the forgoing reasons, there is a need for solving the above-mentioned problem by providing a display panel and a method for manufacturing the display panel.

SUMMARY

An objective of the present invention is to provide a display panel and a method for manufacturing the display panel. By changing wiring configuration of the start signal line in the display panel, the crossing of wiring between the start signal line and the signal output lines is reduced to reduce the probability of occurrence of electrostatic discharge so as to increase the production yield of the display panel.

A display panel is provided. The display panel comprises a display area, a shift register circuit, a first start signal line, and a second start signal line. The shift register circuit is electrically coupled to the display area through a plurality of signal output lines. The first start signal line is electrically coupled to the shift register circuit. The second start signal line is electrically coupled to the shift register circuit. The first start signal line and the second start signal line are both arranged without crossing the signal output lines.

In the foregoing, the shift register circuit has a first side and a second side opposite to the first side. The first side of the shift register circuit is electrically coupled to the display area through the plurality of signal output lines. The first start signal line is disposed at least along the second side of the shift register circuit.

In the foregoing, the display panel further comprises a plurality of high frequency signal lines, a plurality of low frequency signal lines, and a reference signal line. The plurality of high frequency signal lines are electrically coupled to the shift register circuit. The plurality of low frequency signal lines are electrically coupled to the shift register circuit. The reference signal line is connected to a bonding pad and surrounds the plurality of high frequency signal lines and the plurality of low frequency signal lines.

In the foregoing, the first start signal line is the farthest signal line from the shift register circuit among the plurality of high frequency signal lines, the plurality of low frequency signal lines, and the reference signal line.

In the foregoing, the first start signal line is disposed around the plurality of high frequency signal lines, the plurality of low frequency signal lines, and the reference signal line.

The invention provides a display panel. The display panel comprises a display area, a shift register circuit, and a plurality of signal lines. The shift register circuit is configured for respectively providing gate signals to the display area through a plurality of signal output lines. The plurality of signal lines comprise a first start signal line and a second start signal line. The first start signal line is configured for providing a start signal or a reset signal to the shift register circuit. The second start signal line is the nearest signal line to the display area among the plurality of signal lines. A control of the second start signal line is independent from a control of the first start signal line. The second start signal line is configured for providing the start signal or the reset signal to the shift register circuit.

In the foregoing, the shift register circuit has a first side and a second side opposite to the first side. The first side of the shift register circuit provides the gate signals to the display area through the plurality of signal output lines. The first start signal line is disposed at least along the second side of the shift register circuit.

In the foregoing, the first start signal line is the farthest signal line from the shift register circuit among the plurality of signal lines.

In the foregoing, the plurality of signal lines comprises a plurality of high frequency signal lines, a plurality of low frequency signal lines, and a reference signal line. The plurality of high frequency signal lines are configured for providing a high frequency signal to the shift register circuit. The plurality of low frequency signal lines are configured for providing a low frequency signal to the shift register circuit. The reference signal line surrounds the plurality of high frequency signal lines and the plurality of low frequency lines so as to shield the plurality of high frequency signal lines and the plurality of low frequency lines.

In the foregoing, the first start signal line is disposed around the plurality of high frequency signal lines, the plurality of low frequency signal lines, and the reference signal line.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. However, the embodiments provided herein are intended as illustrative only since numerous modifications and variations therein will be apparent to those skilled in the art. Description of the operation does not intend to limit the operation sequence. Any structures resulting from recombination of components with equivalent effects are within the scope of the present invention. In addition, drawings are only for the purpose of illustration and not plotted according to the original size. Wherever possible, the same reference numbers are used in the drawings and the description to refer to the same or like parts.

As used herein, both "couple" and "connect" refer to direct physical contact or electrical contact or indirect physical contact or electrical contact between two or more components. Or they can also refer to reciprocal operations or actions between two or more components.

Figure 1:
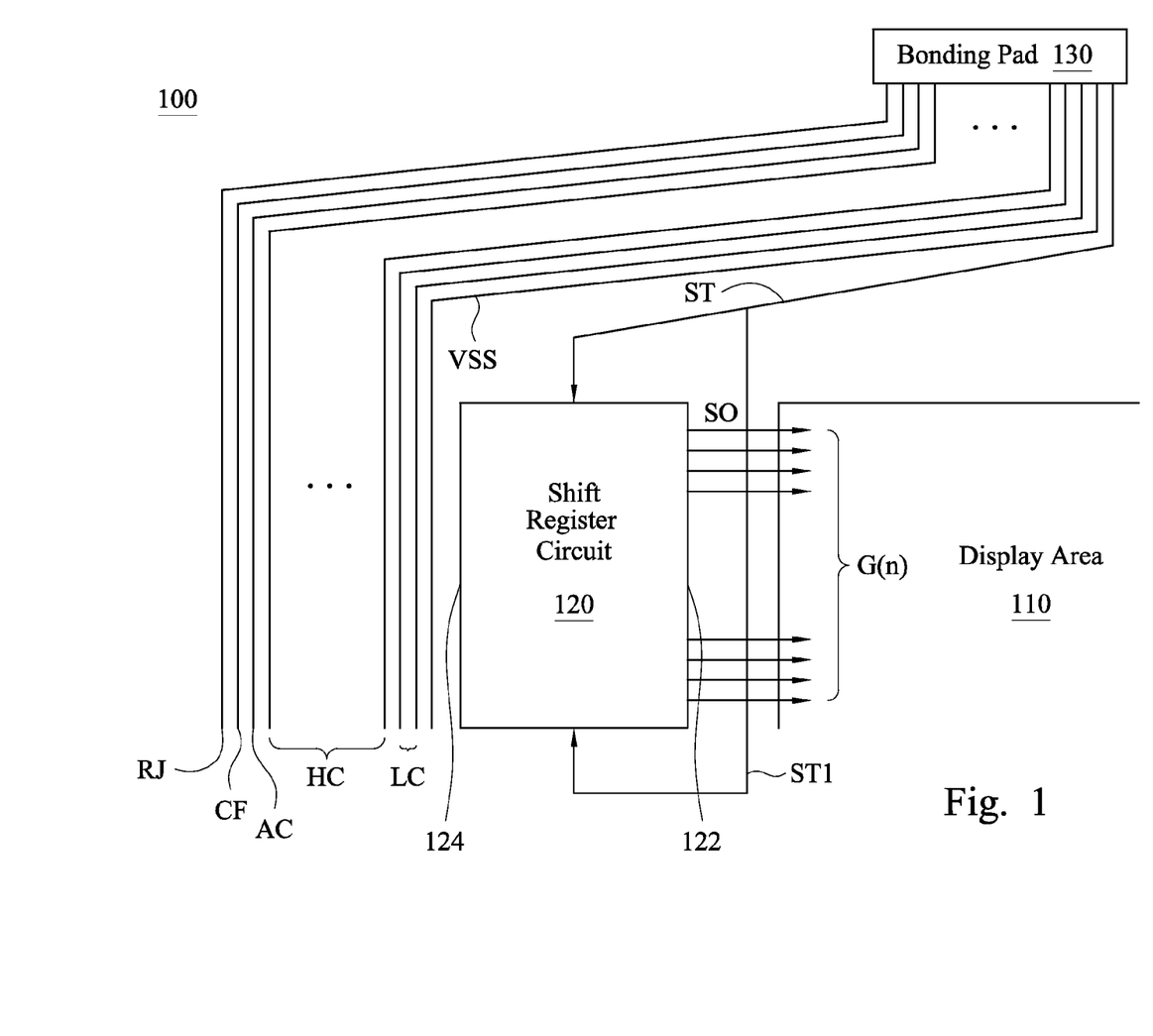
FIG. 1 depicts a schematic diagram of a display panel according to the prior art.

FIG. 1 depicts a schematic diagram of a display panel according to the prior art. As shown in FIG. 1, a display panel 100 comprises a display area 110, a shift register circuit 120, and a bonding pad 130.

As shown in FIG. 1, the shift register circuit 120 has a first side 122 and a second side 124 opposite to the first side 122. In the display panel 100, a branch start signal line ST1 of a start signal line ST is disposed between the first side 122 of the shift register circuit 120 and the display area 110, and is configured for transmitting a start signal or a reset signal to the shift register circuit 120 from the bonding pad 130. Signal output lines SO are disposed on the first side 122 of the shift register circuit 120 and electrically connected to the shift register circuit 120. The signal output lines SO are configured for outputting a gate signal G(n) to the display area 110 from the shift register circuit 120.

In the above-mentioned disposition, wiring of the first start signal line ST1 crosses wiring of the signal output lines SO between the first side 122 of the shift register circuit 120 and the display area 110. The situation of crossing of wiring thus results in the phenomenon of electrostatic discharge (ESD) which affects the correctness of the gate signal G(n) on the signal output lines SO so as to cause abnormal displays in the display area 110.

In addition, as shown in FIG. 1, a reference signal line VSS, high frequency signal lines HC, low frequency signal lines LC, an array signal line AC, a filtering signal line CF, and a repairing signal line RJ are disposed beside the second side 124 of the shift register circuit 120.

During the manufacturing process of the display panel 100, a nozzle is utilized to fill in an adhesive (such as a sealant) on the signal lines beside the second side 124 of the shift register circuit 120 after the above-mentioned signal line configuration is fabricated. In addition, a hole is cut over the signal lines on the outer side of the display panel 100 so that the adhesive can be illuminated and thus hardened.

In the display panel 100, the high frequency signal lines HC are immediately adjacent to the array signal line AC, the filtering signal line CF, and the repairing signal line RJ which are disposed on the outermost side of the display panel 100. Hence, the high frequency signal lines HC have a higher probability of being cut during the cutting process. Since a resistance of the signal line increases when the signal line is cut, an impedance of the high frequency signal line HC that is cut does not match with an impedance of the high frequency signal line HC that is not cut. As a result, the display operation in the display area 110 is abnormal (for example, bright lines and dark lines appear in the display area).

In order to improve the above problem, the present invention provides a wiring configuration method different from that of the prior art display panel.

Figure 2:
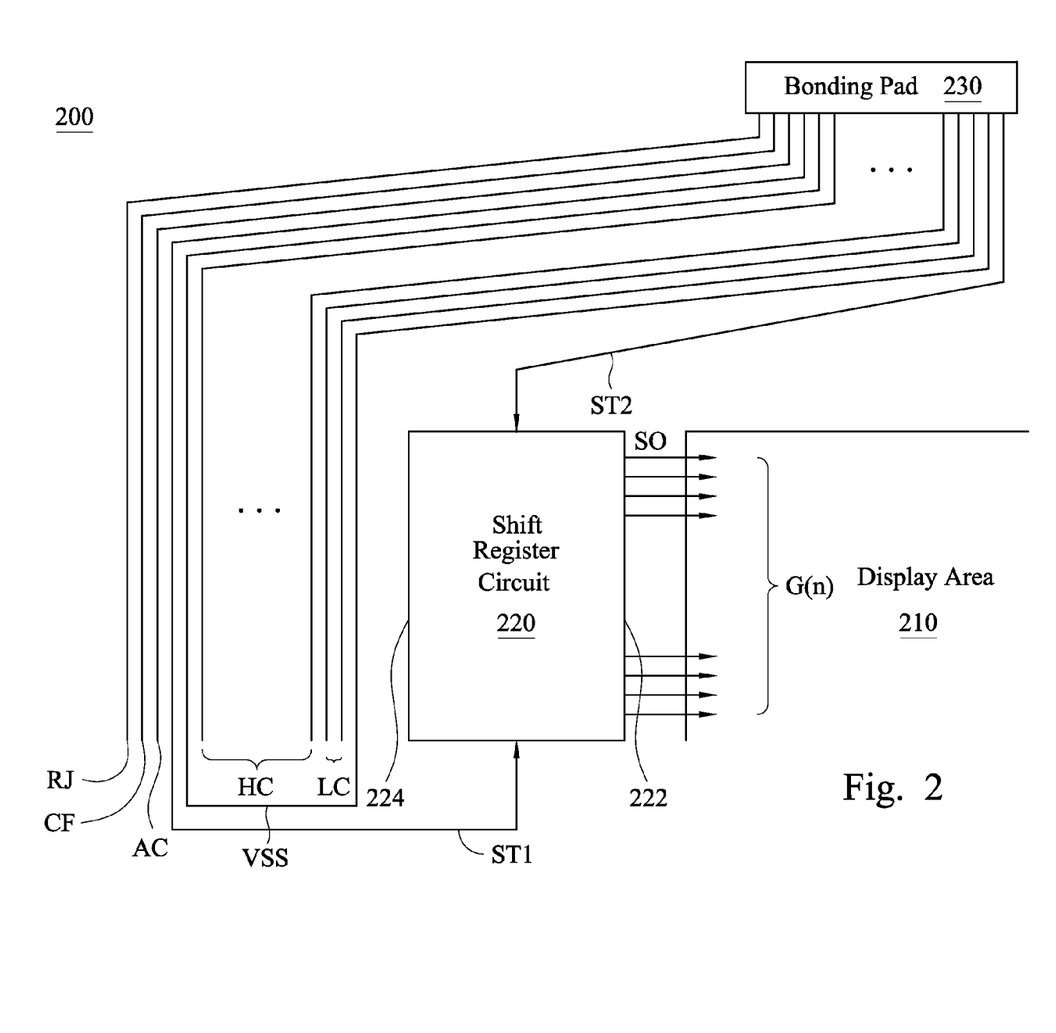
FIG. 2 depicts a schematic diagram of a display panel according to one embodiment of this invention.

FIG. 2 depicts a schematic diagram of a display panel according to one embodiment of this invention. A display panel 200 comprises a display area 210, a shift register circuit 220, and a plurality of signal lines. The plurality of signal lines comprise a plurality of signal output lines SO, a first start signal line ST1, and a second start signal line ST2.

Figure 3A:
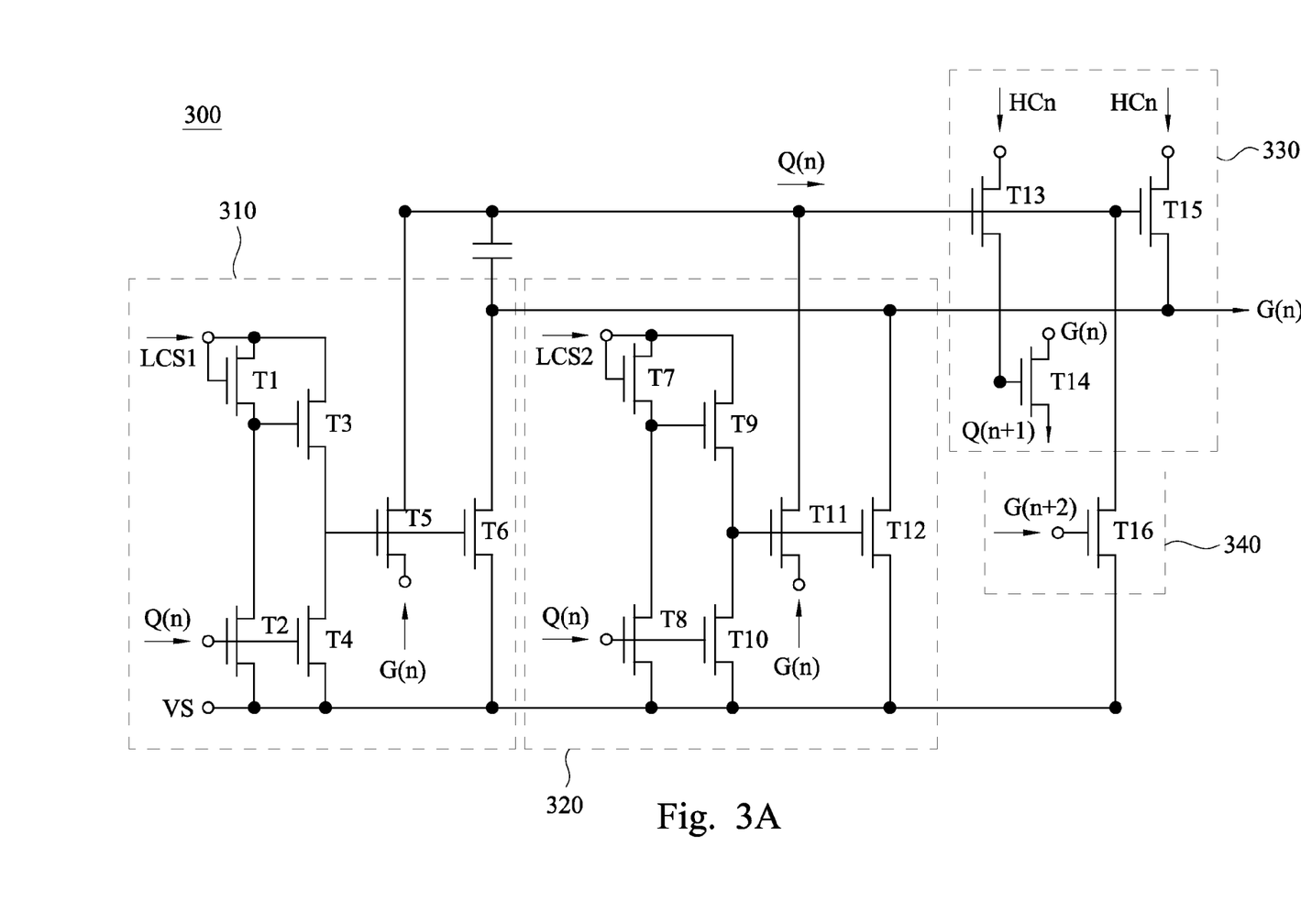
FIG. 3A depicts a schematic diagram of a single stage shift register in a shift register circuit according to one embodiment of this invention.

The above-mentioned shift register circuit 220 comprises a plurality of stages of shift registers. FIG. 3A depicts a schematic diagram of a single stage shift register in a shift register circuit according to one embodiment of this invention. As shown in FIG. 3A, a single stage shift register 300 comprises voltage stabilizing units 310 and 320, an output unit 330, and a reset unit 340.

As shown in FIG. 3A, the voltage stabilizing unit 310 comprises a plurality of transistors T1-T6 and is controlled by a low frequency signal LCS1 and a driving signal Q(n). The voltage stabilizing unit 320 comprises a plurality of transistors T7-T12 and is controlled by a low frequency signal LCS2 and the driving signal Q(n). In addition, the voltage stabilizing units 310, 320 are both connected to a reference signal VS.

The output unit 330 comprises transistors T13-T15. The output unit 330 is controlled by the driving signal Q(n) to allow the transistors T13-T15 in the output unit 330 to enable or disable so as to selectively receive a high frequency signal HCn which serves as the gate signal G(n) output from the output unit 330.

In addition, the output unit 330 of a specific stage is configured for providing a driving signal Q(n+1) to the output unit 330 of the next stage shift register 300 through the transistor T14 in the specific stage.

The reset unit 340 is a transistor T16 which resets the driving signal Q(n) of the current stage shift register 300 according to a gate signal G(n+2) of the shift register 300 two stages following the current stage shift register 300.

In the above label, n is an integer equal to or greater than 1 and denotes the stage number of the shift register 300. For example, n=1 denotes the first stage shift register, n=2 denotes the second stage shift register.

It is noted that the driving signal Q(n) of the output unit 330 is obtained from the output unit 330 of the previous stage shift register 330. Since the output unit 330 of the first stage shift register 330 cannot obtain the driving signal Q(n)

from the previous stage shift register, the first stage shift register 300 is set to obtain the driving signal Q(n) from a start signal STS.

Additionally, the reset unit 340 resets the driving signal Q(n) of the current stage shift register 300 according to the gate signal G(n+2) of the shift register 300 two stages ahead the current stage shift register 300. Since the last two stage shift registers 300 in the shift register circuit 220 do not correspond to any of the shift registers which are the shift registers 300 two stages ahead the last two stage shift registers 300, a reset signal RST is set to be the gate signal G(n+2) input to the reset units 340 of the last two stage shift registers 300.

For example, the display panel 200 is a widescreen high-definition (Full HD) display panel and has a resolution of 1920*1080. In other words, the shift register circuit 220 has 1080 stages of the shift registers 300. Based on the above description, the reset units 340 of the $1079^{th}$ stage shift register 300 and the $1080^{th}$ stage shift register 300 need to be controlled by the gate signal G(n) of the $1081^{th}$ stage shift register 300 and the $1082^{th}$ stage shift register 300. Since the shift register circuit 220 only has 1080 stages of the shift registers 300, the reset unit 340 of each of the $1079^{th}$ stage shift register 300 and the $1080^{th}$ stage shift register 300 is driven by the reset signal RST.

Figure 3B:
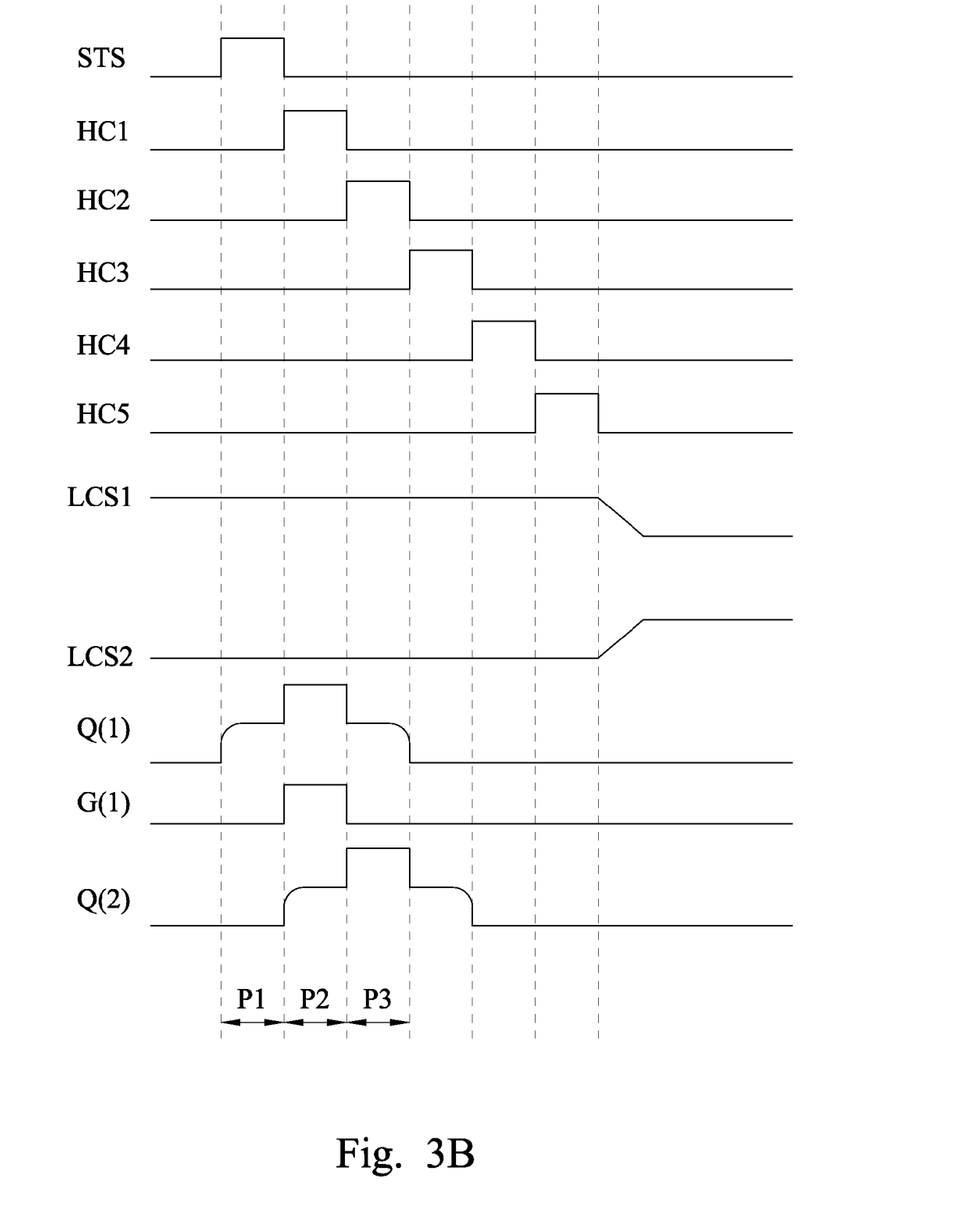
FIG. 3B depicts a time waveform of a first stage shift register according to one embodiment of this invention.

FIG. 3B depicts a time waveform of a first stage shift register according to one embodiment of this invention. To clarify matters, a description is provided by taking the first stage shift register (n=1) for example with reference to FIG. 3A. As shown in FIG. 3B, first, the start signal STS is at a high voltage level during a time interval P1. At this time, the voltage stabilizing unit 310 is turned on according to the low frequency signal LCS1 at the high voltage level, and the voltage stabilizing unit 320 is turned off according to the low frequency signal LCS2 at a low voltage level. As shown in FIG. 3B, a driving signal Q(1) slightly rises after receiving the start signal STS. Then, during a time interval P2, the driving signal Q(1) as mentioned above is input to the output unit 330 so that a high frequency signal HC1 is output through the transistor T15 and serves as a gate signal G(1). The gate signal G(1) is output through the transistor T14 so as to serve as a driving signal Q(2) for driving the output unit 330 of the second stage shift register 300. Finally, during a time interval P3, the gate signal G(1) is stabilized at the low voltage level.

In addition, as shown in FIG. 3B, the high frequency signal HCn of various stages of the shift registers 300 output a pulse in sequence, and the low frequency signals LCS1, LCS2 swap their voltage levels at a time point. A frequency of the high frequency signal HCn is higher than that of the low frequency signals LCS1, LCS2, and the frequency of the low frequency signals LCS1, LCS2 is higher than a change frequency of the reference signal VS.

As shown in FIG. 2, the shift register circuit 220 is electrically coupled to the display area 210 through the signal output lines SO so as to respectively provide the gate signal G(n) to the display area 210. The display area 210 thus displays according to the gate signal G(n). In one embodiment, the shift register circuit 220 has a first side 222 and a second side 224 opposite to the first side 222. The first side 222 of the shift register circuit 220 is electrically coupled to the display area 210 through the signal output lines SO.

The first start signal line ST1 is disposed along the second side 224 of the shift register circuit 220 and is electrically coupled to the shift register circuit 220 and a bonding pad 230. The start signal STS or the reset signal RST is thus provided to the shift register circuit 220 from the bonding pad 230.

The second start signal line ST2 is electrically coupled to the shift register circuit 220 and the bonding pad 230 so as to provide the start signal STS or the reset signal RST to the shift register circuit 220 from the bonding pad 230. The start signal STS as mentioned above is used for starting the shift register circuit 220, and the reset signal RST is used for resetting the shift register circuit 220 so as to retransmit the gate signal G(n).

It is noted that the disposition of the second start signal line ST2 is independent from that of the first start signal line ST1, and the second start signal line ST2 is the nearest signal line to the display area 210 among all of the signal lines in the display panel 200.

In addition, as compared with the display panel 100 shown in FIG. 1, wiring of the first start signal line ST1 and the second start signal line ST2 does not cross the signal output lines SO according to the present embodiment, which effectively reduces the electrostatic discharge occurring between the first side 222 of the shift register circuit 220 and the display area 210. Hence, the gate signal G(n) transmitted by the signal output lines SO is input to the display area 210 correctly to allow the display area 210 to function properly, thus increasing the production yield of the display panel 210.

In another embodiment, the display panel 200 further comprises a plurality of high frequency signal lines HC, two low frequency signal lines LC, and a reference signal line VSS.

As shown in FIG. 2, the high frequency signal lines HC are all disposed beside the second side 224 of the shift register circuit 220. In greater detail, the high frequency signal lines HC are disposed at a position closer to the shift register circuit 220 than the first start signal line ST1. Additionally, the high frequency signal lines HC are electrically coupled to the shift register circuit 220 and the bonding pad 230 so as to provide the high frequency signal HCn to the shift register circuit 220 from the bonding pad 230. In one embodiment, the high frequency signal HCn on the high frequency signal lines HC is related to the gate signal G(n), for example, the high frequency signal HCn may comprise major information signal which serves as the gate signal G(n).

The low frequency signal lines LC are disposed beside the second side 224 of the shift register circuit 220. In greater detail, the low frequency signal lines LC are disposed between the high frequency signal lines HC and the second side 224 of the shift register circuit 220. In addition, the low frequency signal lines LC are electrically coupled to the shift register circuit 220 and the bonding pad 230 so as to provide the low frequency signals LCS1, LCS2 to the shift register circuit 220 from the bonding pad 230. The low frequency signals LCS1, LCS2 may be used for stabilizing the gate signal G(n) transmitted to the display area 210, thus having the function of stabilizing voltage.

Additionally, the reference signal line VSS configured for transmitting the reference signal VS is disposed beside the second side 224 of the shift register circuit 220. The reference signal line VSS is disposed at a position closer to the shift register circuit 220 than the first start signal line ST1. In greater detail, the reference signal line VSS is connected to the bonding pad 230. Wiring of the reference signal line VSS starts from an outer pin of the bonding pad 230, is disposed between the first start signal line ST1 and the high frequency signal lines HC, and disposed away from ends of the high frequency signals HC and the low frequency signal lines LC, is then disposed between the low frequency signal lines LC and the second side 224 of the shift register circuit 220, and is finally connected to an inner pin of the bonding pad 230.

With the above wiring configuration, the reference signal line VSS surrounds the high frequency signal lines HC and the low frequency signal lines LC so as to shield the high frequency signal lines HC and the low frequency signal lines LC. Thus, the high frequency signal HCn and the low frequency signals LCS1, LCS2 are stabilized.

Additionally, in some embodiments, a line width of the reference signal line VSS between the first start signal line ST1 and the high frequency signal lines HC is greater than a line width of the reference signal line VSS between the low frequency signal lines LC and the second side 224 of the shift register circuit 220 in the disposition of the reference signal line VSS. It is noted that the line width of the reference signal line VSS between the first start signal line ST1 and the high frequency signal lines HC may be adjusted as required by practical needs.

For example, if there is more room between the boundary of the display panel 200 and the shift register circuit 220, the line width of the reference signal line VSS between the first start signal line ST1 and the high frequency signal lines HC is increased and the line width of the reference signal line VSS between the low frequency signal lines LC and the second side 224 of the shift register circuit 220 is decreased. With such a configuration, wiring of the high frequency signal lines HC and the low frequency signal lines LC shifts towards the shift register circuit 220. Hence, during the manufacturing process of the display panel 200, the probability that the high frequency signal lines HC are cut is greatly reduced. As a result, the high frequency signal HCn on the high frequency signal lines HC can be correctly input to the shift register circuit 220 and the gate signal G(n) can be accurately input to the display area 210 correspondingly, thus reducing the possibility of abnormal displays in the display area 210.

It is noted that, as shown in FIG. 2, the first start signal line ST1 is the farthest signal line from the second side 224 of the shift register circuit 220 among all the signal lines as mentioned above according to one embodiment. In other words, the first start signal line ST1 is disposed beside the second side 224 of the shift register circuit 220 and is disposed on the outermost side of the display panel 200 when compared with the high frequency signal lines HC, the low frequency signal lines LC, and the reference signal lien VSS.

In addition, as shown in FIG. 2, the display panel 200 may further comprise an array signal line AC, a filtering signal line CF, and a repairing signal line RJ.

As shown in FIG. 2, the array signal line AC, the filtering signal line CF, and the repairing signal line RJ are disposed beside the first start signal line ST1 (such as between the boundary of the display panel 200 and the first start signal line ST1). The array signal line AC is adjacent to the first start signal line ST1. The filtering signal line CF is adjacent to the array signal line AC and is disposed beside the array signal lien AC. In addition to that, the repairing signal line RJ is immediately adjacent to the filtering signal line CF and is disposed beside the filtering signal line CF.

The configuration of the array signal line AC, the filtering signal line CF, and the repairing signal line RJ shown in FIG. 2 is only by way of example, those of ordinary skill in the art may add other types of signal lines and change the wiring configuration as required by practical needs.

Figure 4:
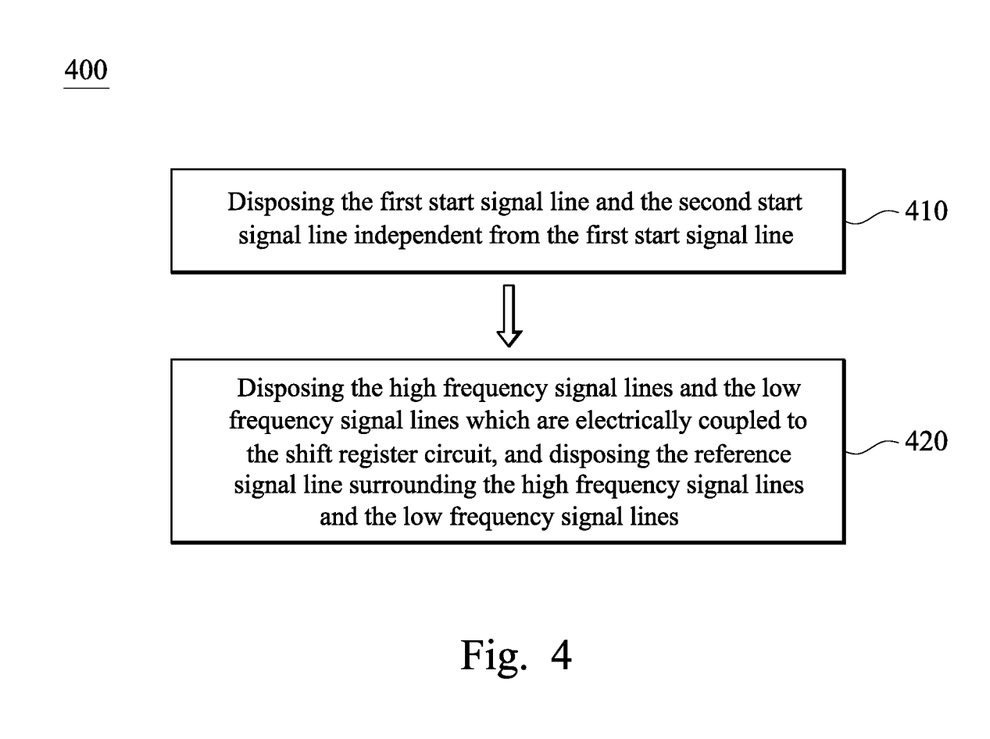
FIG. 4 depicts a flowchart of a method for manufacturing a display panel according to one embodiment of this invention.

FIG. 4 depicts a flowchart of a method for manufacturing a display panel according to one embodiment of this invention. To clarify matters, steps of a method for manufacturing a display panel 400 shown in FIG. 4 are described by way of FIG. 2, but the present invention is not limited to this.

First, disposing the first start signal line ST1 and the second start signal line ST2 independent from the first start signal line ST1 (step 410). Then, disposing the high frequency signal lines HC and the low frequency signal lines LC which are electrically coupled to the shift register circuit 220, and disposing the reference signal line VSS surrounding the high frequency signal lines HC and the low frequency signal lines (step 420).

The first start signal line ST1 and the second start signal line ST2 as mentioned above are both electrically coupled to the shift register circuit 220 and configured for transmitting a start signal or a reset signal to the shift register circuit 220. After that, the shift register circuit 220 is electrically coupled to the display area 210 through the plurality of signal output lines SO so as to transmit the gate signal G(n) to the display area 210.

In one embodiment, the first start signal line ST1 and the second start signal line ST2 are both arranged without crossing the signal output lines SO to reduce the probability of occurrence of electrostatic discharge. As a result, the possibility of abnormal displays in the display area 210 is reduced.

In another embodiment, the shift register circuit 220 has the first side 222 and the second side 224 opposite to the first side 222. The first side 222 of the shift register circuit 220 is electrically coupled to the display area 210 through the signal output lines SO. The first start signal line ST1 is disposed at least along the second side 224 of the shift register circuit 220.

In yet another embodiment, the first start signal line ST1 is the signal line farther from the shift register circuit 220 between the first start signal line ST1 and the second start signal line ST2.

It should be understood that the sequence of the steps described in the above embodiment, unless otherwise specified, may be changed as required by practical needs, or the steps or part of the steps may be performed simultaneously. The flowchart shown in FIG. 4 is only one embodiment and is not intended to limit the present invention.

In summary, the first start signal line is disposed between the array signal line and the reference signal line in the present invention display panel so as to resolve the problem of crossing of wiring between the first start signal line and the signal output lines occurring between the first side of the shift register circuit and the display area. As a result, the probability of occurrence of electrostatic discharge is reduced to reduce the possibility of abnormal displays in the display area.

In addition, the reference signal line is arranged to surround the high frequency signal lines and the low frequency signal lines in the present invention display panel so as to generate the metal shielding effect. The high frequency signal and the low frequency signal are thus not interfered by external noises, increasing the stability of the high frequency signal and the low frequency signal.

Additionally, the line width of the reference signal line between the first start signal line and the high frequency signal lines is increased in the present invention display panel so as to reduce the probability that the high frequency signal lines are cut during the manufacturing process of the display panel. Hence, the abnormal display situation of the display area is correspondingly reduced.

Furthermore, when compared with the prior art, although extra pins of the bonding pad are used according to the present invention, the extra pins utilized in the present invention are those existing in the prior art but not being used. Therefore, under the premise that no extra integrated circuit and cost need to be added, changing the wiring configuration of the first start signal line and the reference signal line reduces the probability of inducing electrostatic discharge according to the present invention. In addition to that, the probability that the high frequency signal lines are cut during the manufacturing process of the display panel is reduced. The stability of the high frequency signal lines and the low frequency signal is increased. As a result, the probability of abnormal display in the display area is reduced to increase the production yield of the display panel.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel comprising:
   a display area;
   a shift register circuit, the shift register circuit being electrically coupled to the display area through a plurality of signal output lines;
   a first start signal line electrically coupled to the shift register circuit;
   a second start signal line electrically coupled to the shift register circuit;
   a plurality of high frequency signal lines electrically coupled to the shift register circuit;
   a plurality of low frequency signal lines electrically coupled to the shift register circuit; and
   a reference signal line connected to a bonding pad and surrounding the plurality of high frequency signal lines and the plurality of low frequency signal lines,
   wherein the reference signal line, the first start signal line and the second start signal line are all arranged without crossing the signal output lines.

2. The display panel of claim 1, wherein the shift register circuit has a first side and a second side opposite to the first side, the first side of the shift register circuit is electrically coupled to the display area through the plurality of signal output lines, and the first start signal line is disposed at least along the second side of the shift register circuit.

3. The display panel of claim 1, wherein the first start signal line is the farthest signal line from the shift register circuit among the plurality of high frequency signal lines, the plurality of low frequency signal lines, and the reference signal line.

4. The display panel of claim 3, wherein the first start signal line is disposed around the plurality of high frequency signal lines, the plurality of low frequency signal lines, and the reference signal line.

5. A display panel comprising:
   a display area;
   a shift register circuit configured for respectively providing gate signals to the display area through a plurality of signal output lines;
   and a plurality of signal lines comprising:
   a first start signal line configured for providing a start signal or a reset signal to the shift register circuit;
   a second start signal line being the nearest signal line to the display area among the plurality of signal lines, a control of the second start signal line being independent from a control of the first start signal line, and the second start signal line being configured for providing the start signal or the reset signal to the shift register circuit a plurality of high frequency signal lines configured for providing a high frequency signal to the shift register circuit;
   a plurality of low frequency signal lines configured for providing a low frequency signal to the shift register circuit; and
   a reference signal line surrounding the plurality of high frequency signal lines and the plurality of low frequency lines so as to shield the plurality of high frequency signal lines and the plurality of low frequency lines, wherein the reference signal line, the first start signal line and the second start signal line are all arranged without crossing the signal output lines.

6. The display panel of claim 5, wherein the shift register circuit has a first side and a second side opposite to the first side, the first side of the shift register circuit is configured to provide the gate signals to the display area through the plurality of signal output lines, and the first start signal line is disposed at least along the second side of the shift register circuit.

7. The display panel of claim 5, wherein the first start signal line is the farthest signal line from the shift register circuit among the plurality of signal lines.

8. The display panel of claim 5, wherein the first start signal line is disposed around the plurality of high frequency signal lines, the plurality of low frequency signal lines, and the reference signal line.

* * * * *